(12) United States Patent
Tsai et al.

(10) Patent No.: US 6,548,159 B2
(45) Date of Patent: Apr. 15, 2003

(54) EPOXY/CLAY NANOCOMPOSITE FOR MAKING PRINTED CIRCUIT BOARDS

(75) Inventors: Tsung-Yen Tsai, Hsinchu Hsien (TW); Sung-Jeng Jong, Pingtung Hsien (TW); An-Chi Yeh, Kaohsiung (TW); Joshua Chiang, Taipei (TW); Bor-Ren Fang, Taipei (TW)

(73) Assignees: Industrial Technology Research Institute, Hsinchu (TW); Nan Ya Plastics Corporation, Taipei (TW)

( * ) Notice: Subject to any disclaimer, the term of this patent is extended or adjusted under 35 U.S.C. 154(b) by 0 days.

(21) Appl. No.: 09/987,165

(22) Filed: Nov. 13, 2001

(65) Prior Publication Data
US 2003/0039812 A1 Feb. 27, 2003

(30) Foreign Application Priority Data
Aug. 9, 2001 (TW) ........................................ 90119526 A

(51) Int. Cl.$^7$ .............................................. B32B 18/00
(52) U.S. Cl. ........................ 428/325; 428/209; 428/324; 428/413; 174/258; 442/70
(58) Field of Search .................................. 428/209, 324, 428/413, 417, 325; 174/258; 442/70

(56) References Cited

U.S. PATENT DOCUMENTS

| | | | | |
|---|---|---|---|---|
| 5,514,734 A | * | 5/1996 | Maxfield et al. | 523/204 |
| 6,190,775 B1 | * | 2/2001 | Smith et al. | 428/417 |
| 6,287,639 B1 | * | 9/2001 | Schmidt et al. | 427/387 |
| 6,414,069 B1 | * | 7/2002 | Pinnavaia et al. | 524/445 |

* cited by examiner

*Primary Examiner*—Cathy Lam
(74) *Attorney, Agent, or Firm*—Sughrue Mion, PLLC

(57) ABSTRACT

An epoxy/clay nanocomposite suitable for use as matrix material for printed circuit boards is disclosed. The nanocomposite of the present invention comprises a layered clay material uniformly dispersed in an epoxy polymer matrix, wherein the clay material has been modified to an organoclay by ion exchange with (1) benzalkonium chloride and (2) dicyandiamide or tetraethylenepentamine. The epoxy/clay nanocomposites of the present invention have superior dimensional and thermal stability, and a lower hygroscopic property. The invention also includes the prepregs or circuit boards containing the epoxy/clay nanocomposite.

18 Claims, 2 Drawing Sheets

EPOXY/CLAY NANOCOMPOSITE FOR MAKING PRINTED CIRCUIT BOARDS

BACKGROUND OF THE INVENTION

1. Field of the Invention

The present invention relates in general to a nanocomposite. More particularly, it relates to an epoxy/clay nanocomposite and its use as matrix material for printed circuit boards.

2. Description of the Related Arts

Circuit boards find a wide variety of uses in the electrical industry such as radios, televisions, and various electrical apparatus. A widely employed technique for preparing circuit boards is to impregnate a woven fiberglass sheet with a resin composition and then laminate a copper sheet to one or both sides of the resin impregnated fiberglass sheet. Next, an electrical circuit is etched into the copper to form the circuit board and then electrical connections can be soldered to the board when it is used.

Epoxy resins have been widely used for the purpose of impregnating the fiberglass to prepare the circuit boards. However, the circuit boards thus prepared are not satisfactory when a higher degree of heat resistance, dimensional stability, or less hygroscopicity is required. Therefore, an improvement upon the epoxy resin for use as the matrix material for printed circuit boards is called for. To this end, the present invention proposes using an epoxy/clay nanocomposite as the matrix material for printed circuit boards.

Nanocomposites are a new class of materials that exhibit ultra-fine phase dimensions, typically in the range of 1–100 nm. Experimental work on these materials has generally shown that virtually all types and classes of nanocomposites lead to new and improved properties such as increased stiffness, strength, and heat resistance, and decreased moisture absorption, flammability, and permeability, when compared to their micro- and macrocomposite counterparts. Specifically, commercially available Nylon 6/clay nanocomposite shows that polymer matrix having layered clay minerals dispersed therein exhibits improved mechanical strength, heat distortion temperature (HDT), and impermeability to gas and water.

SUMMARY OF THE INVENTION

An object of the invention is to provide an-epoxy/clay nanocomposite for use as the matrix material for printed circuit boards which can lead to improved thermal and dimensional stability and reduced hygroscopic property.

Another object of the invention is to provide a prepreg for printed circuit boards which contains the epoxy/clay nanocomposite as the matrix material.

A further object of the invention is to provide a printed circuit board made by at least one of the above prepregs.

To achieve the above objects, a layered clay material is modified by ion exchange with (1) benzalkonium chloride and (2) a hardener of dicyandiamide or tetraethylenepentamine. The modifiers used herein can funcitonalize the clay layers and expand the interlayer spacing thereof. The modified clay material is then blended with epoxy oligomers to undergo polymerization. The silicate layers of the clay material are exfoliated during the polymerization and uniformly dispersed throughout the epoxy resin matrix on a nanometer length scale. Thereby, an epoxy/clay nanocomposite suitable as the matrix material for printed circuit boards is obtained with reduced hygroscopicity and improved thermal and dimensional stability.

DETAILED DESCRIPTION OF THE INVENTION

The epoxy/clay nanocomposite in accordance with the present invention includes a polymer matrix comprising an epoxy resin; and a layered clay material uniformly dispersed in the polymer matrix, wherein the layered clay material has been modified by ion exchange with (1) benzalkonium chloride and (2) dicyandiamide or tetraethylenepentamine.

The layered clay material used in the present invention is preferably a layered silicate having a cation-exchange capacity ranging from about 50 to 200 meq/100 g. The layered silicate suitable for use herein includes, for example, smectite clay, vermiculite, halloysite, sericite, mica, and the like. Illustrative of suitable smectite clays are montmorillonite, saponite, beidellite, nontronite, hectorite, and stevensite.

The layered silicate is subjected to intercalation of two distinct modifiers by ion exchange to thereby functionalize the clay material and expand the interlayer spacing between the adjacent silicate layers, such that the silicate layers are more readily exfoliated during the composite formation. The ion-exchange operation can be accomplished by immersing the layered silicate in an aqueous solution containing the modifier, followed by washing the treated layered silicate with water to remove-excess ions. The first modifier used in the present invention is benzalkonium chloride, which serves to introduce a hydrophobic group to improve the compatibility between the clay and the epoxy resin. Thus, a better uniformity can be achieved when the clay layers are exfoliated and dispersed throughout the epoxy matrix. The second modifier is a hardener of either dicyandiamide or tetraethylenepentamine. The hardener can afford a reactive functional group to the clay material to promote bonding with the epoxy resin. By this, the thermal and dimensional stability or other properties can be improved to a large extent even when a small amount of clay is incorporated.

The epoxy/clay nanocomposite of the present invention is prepared by dispersing the above-mentioned modified clay material in oligomers of an epoxy resin, and polymerizing the oligomers into an epoxy polymer. In accordance with the present invention, the modified clay material is preferably present in an amount ranging from about 0.1% to 10% by weight, and more preferably from about 0.5% to 6.0% by weight, based on the total weight of the epoxy/clay composite. It is preferable that the clay material contained in the polymer matrix has interlayer spacing of at least about 18 Å. The epoxy resin suitable for use in the present invention includes but is not limited to bisphenol A type epoxy resins, brominated epoxy resins (bromine content: 5–60 wt %), novolac epoxy resins, multifunctional epoxy resins, and aliphatic epoxy resins. A mixture of the above is also suitable for use. Exemplary epoxy resins include bisphenol A epoxy resin, tetrabromo bisphenol A epoxy resin, tetrabromo bisphenol A polyphenol epoxy resin, ortho-cresol novolac epoxy resin, N,N,N',N'-tetra(2,3-epoxypropyl)-P', P'-methylaniline, N,N-bis(2,3-epoxypropyl)-4-aminophenylepoxypropyl ether, 4-epoxypropylene-N,N-bisepxoypropylaniline and the like.

The epoxy/clay nanocomposite of the present invention may further comprise an ordinary epoxy curing agent such as dicyandiamide, phenol novolak, or trimellitic anhydride (TMA). The amount of the curing agent to be used is 0.7 to 1.2 equivalents based on the epoxy group. An amount of the curing agent of lower than 0.7 equivalents or over 1.2 equivalents based on the epoxy group may result in insufficient curing. In addition, the epoxy/clay nanocomposite may further comprise a curing accelerator commonly used for accelerating the curing of an epoxy resin. The curing accelerator includes, for example, imidazole compounds such as 2-ethyl-4-methylimidazole and 1-benzyl-2-methylimidazole; and tertiary amines such as N',N-dimethylbenzylamine (BDMA). These compounds can be used singly or in a form of mixture. The curing accelerator should be used in a small amount as far as the accelerator is sufficient for accelerating the curing of the epoxy resin. The amount of the curing accelerator to be used is preferably between 0.1 and 1 parts by weight based on 100 parts by weight of the epoxy resin.

The epoxy/clay nanocomposite of the invention is preferably employed to prepare printed circuit boards. In preparing the boards, a fibrous substrate is coated and impregnated with a varnish containing the composite of the present invention. Suitable organic solvents for preparing the varnish include N,N-dimethylformamide, acetone, isopropanol, ethylene glycol monomethyl ether, propylene glycol monomethyl ether, butanol, and methyl ethyl ketone. Subsequent to coating, the impregnated substrate is dried and partially cured to form a dry substrate called a prepreg.

The prepreg thus obtained can be used for manufacturing a copper-clad laminate, a multi-layered laminate, or a printed circuit board by conventional methods well known in the art. For example, a sheet of copper or other conductive materials can be laminated to one or more layers of the prepreg. Then a circuit can be etched to the conductive layer using techniques well-known to form circuit boards. The laminates prepared in accordance with the present invention possess a high dimensional and thermal stability and a low water uptake. In the preferred embodiments of the invention, the laminates can have a coefficient of thermal expansion (CTE) of less than 60 ppm/° C., more preferably less than 50 ppm/° C. before the glass transition temperature (Tg) in the thickness (Z) direction; the water uptake can be less than 0.5 wt %, more preferably less than 0.42 wt % under the conditions of 2 hours and 120° C. in a pressure cooker; the durable time in a 288° C. solder bath can be greater than 3 minutes.

Without intending to limit it in any manner, the present invention will be further illustrated by the following examples.

COMPARATIVE EXAMPLE 1

Incorporating No Clay in Epoxy Resin (BLANK)

2.6 g of dicyandiamide (DICY) hardener, 105.6 g of epoxy resin "EB453" (from Nanya Plastic Company), and a small amount of 2-methylimidazole were dissolved in 58.1 g of acetone and 28.6 g of dimethylformaldehyde (DMF). A prepreg was prepared by impregnating a glass cloth with the above solution, followed by drying the impregnated cloth at 170° C. 8 layers of the prepregs were sandwiched between copper foils and hot pressed at 170° C. for one hour to afford a double sided copper-laminated sheet. Then a circuit was etched from the copper foils. The circuit board was evaluated for moisture adsorption, coefficient of thermal expansion, and thermal stability, and the results are shown in Table 2.

COMPARATIVE EXAMPLE 2

Incorporating Non-modified Clay in Epoxy Resin 2.6 g of dicyandiamide (DICY) hardener, 105.6 g of epoxy resin "EB453" (from Nanya Plastic Company), and catalytic amount of 2-methylimidazole were dissolved in 58.1 g of acetone and 28.6 g of dimethyl formamide (DMF). 2 wt % of montmorillonite "PK-802" (from Pai Kong Co.) was added to the above solution, followed by stirring for 16 hours to give a dispersion. A prepreg was prepared by impregnating a glass cloth with the above dispersion, followed by drying the impregnated cloth at 170° C. 8 layers of the prepregs were sandwiched between copper foils and hot pressed at 170° C. for one hour to afford a double sided copper-laminated sheet. Then a circuit was etched from the copper foils.

Figure 1:
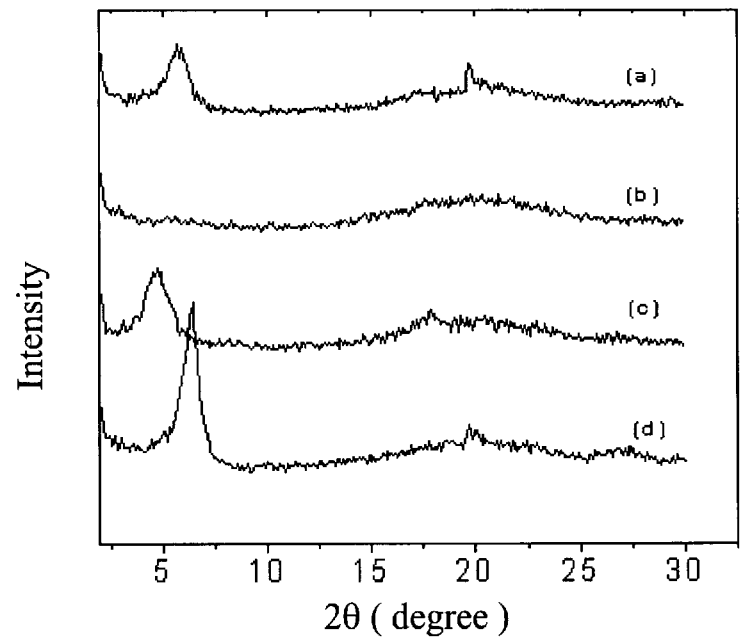
FIG. 1 illustrates X-ray diffraction profiles of composites of (a) epoxy/CLAY, (b) epoxy/BEN/CLAY, (c) epoxy/DICY/CLAY, and (d) epoxy/TEP/CLAY.

X-ray diffraction (XRD) analysis was performed on the epoxy/clay composite sample. The XRD pattern is shown in FIG. 1 and the interlayer spacing data are listed in Table 1. The XRD analysis indicates that the interlayer spacing of the clay was slightly increased from 12.4 Å to 15.7 Å after composite formation, suggesting that only a small amount of epoxy resin was included between the montmorillonite layers.

COMPARATIVE EXAMPLE 3

Incorporating Clay Modified by Single Modifier in Epoxy Resin 50 g of montmorillonite "PK-802" (from Pai Kong Co.) was dispersed in 4500 ml of deionized water, followed by stirring for 4 hours to give a liquid suspension. To the liquid suspension, a solution containing 4.73 g dicyandiamide in 56 ml 1M HCl was slowly added with vigorous stirring. After the addition was completed, the mixture was stirred for 6 hours at room temperature. Subsequently, the mixture was filtered and washed with deionized water. The filtering and washing procedures were repeated three times. The clean compact was dried and crushed into powder. The montmorillonite powder modified by dicyandiamide is referred to as "DICY/CLAY". Likewise, the montmorillonite powder modified by tetraethylenepentamine (referred to as "TEP/CLAY") and the montmorillonite powder modified by benzalkonium chloride (referred to as "BEN/CLAY") were prepared by the same procedure except that 4.73 g of dicyandiamide was replaced by 10.65 g of tetraethylenepentamine and 172 ml of 10 wt % benzalkonium chloride solution, respectively.

2.6 g of dicyandiamide (DICY) hardener, 105.6 g of epoxy resin "EB453" (from Nanya Plastic Company), and catalytic amount of 2-methylimidazole were dissolved in 58.1 g of acetone and 28.6 g of dimethyl formamide (DMF). 2 wt % of DICY/CLAY, TEP/CLAY, or BEN/CLAY was added to the above solution, followed by stirring for 16 hours to give a dispersion. A prepreg was prepared by impregnating a glass cloth with the above dispersion, followed by drying the impregnated cloth at 170° C. 8 layers of the prepregs were sandwiched between copper foils and hot pressed at 170° C. for one hour to afford a double sided copper-laminated sheet. Then a circuit was etched from the copper foils.

X-ray diffraction (XRD) analysis was performed on the epoxy/clay composite samples. The XRD patterns are shown in FIG. 1 and the interlayer spacing data are listed in Table 1. The interlayer spacing of the epoxy/DICY/CLAY composite was slightly increased from 15 Å to 19.2 Å, and that of the epoxy/TEP/CLAY composite was slightly increased from 13.5 Å to 14 Å after composite formation. The results indicate the montmorillonite layers were poorly separated in the epoxy matrix. On the other hand, XRD analysis of the epoxy/BEN/CLAY composite lacked clay (001) reflections between 2–10°. The absence of the clay (001) reflections indicates the interlayer spacing of the montmorillonite layers had a value greater than 44 Å, suggesting the montmorillonite layers were exfoliated in the epoxy matrix.

EXAMPLE

Incorporating Clay Modified by Two Modifiers in Epoxy Resin 50 g of montmorillonite "PK-802" (from Pai Kong Co.) was dispersed in 4500 ml of deionized water, followed by stirring for 4 hours to give a liquid suspension. To the liquid suspension, (1) a solution containing 1.25 g dicyandiamide in 30 ml 1M HCl and (2) 172 ml of 10 wt % benzalkonium chloride solution were slowly added with vigorous stirring. After the addition was completed, the mixture was stirred for 6 hours at room temperature. Subsequently, the mixture was filtered and washed with deionized water. The filtering and washing procedures were repeated three times. The clean compact was dried and crushed into powder. The montmorillonite powder modified by dicyandiamide and benzalkonium chloride is referred to as "DICY/BEN/CLAY". Likewise, the montmorillonite powder modified by tetraethylenepentamine and benzalkonium chloride (referred to as "TEP/BEN/CLAY") were prepared by the same procedure except that the dicyandiamide solution was replaced by a solution containing 2.85 g tetraethylenepentamine in 20 ml of 1M HCl.

2.6 g of dicyandiamide (DICY) hardener, 105.6 g of epoxy resin "EB453" (from Nanya Plastic Company), and catalytic amount of 2-methylimidazole were dissolved in 58.1 g of acetone and 28.6 g of dimethyl formamide (DMF). DICY/BEN/CLAY or TEP/BEN/CLAY was added to the above solution, followed by stirring for 16 hours to give a dispersion. The dispersions with 3 wt % and 5 wt % of clay contents were prepared, respectively. A prepreg was prepared by impregnating a glass cloth with the dispersion, followed by drying the impregnated cloth at 170° C. 8 layers of the prepregs were sandwiched between copper foils and hot pressed at 170° C. for one hour to afford a double sided copper-laminated sheet. Then a circuit was etched from the copper foils.

Figure 2:
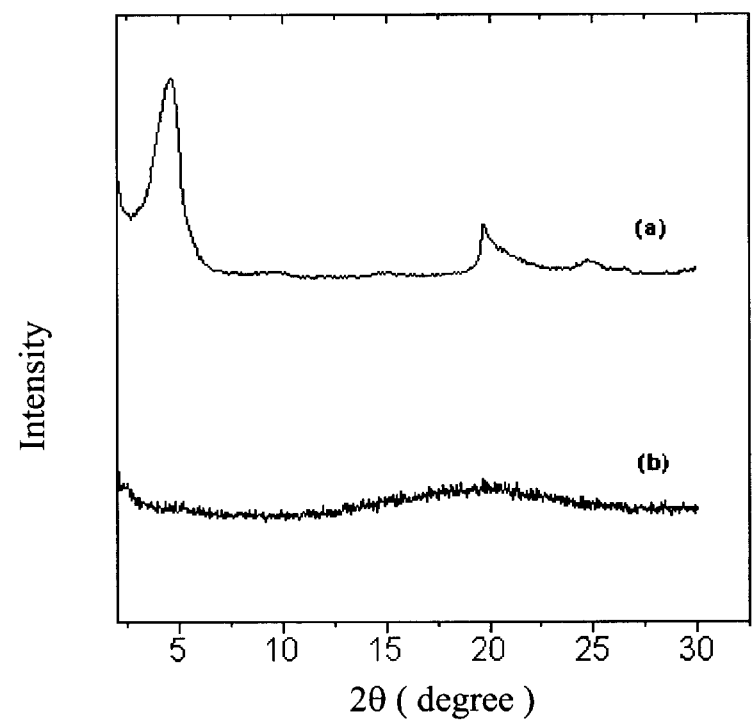
FIG. 2 illustrates X-ray diffraction profiles of (a) DICY/BEN/CLAY, and (b) epoxy/DICY/BEN/CLAY composite (5 wt % clay)
Figure 3:
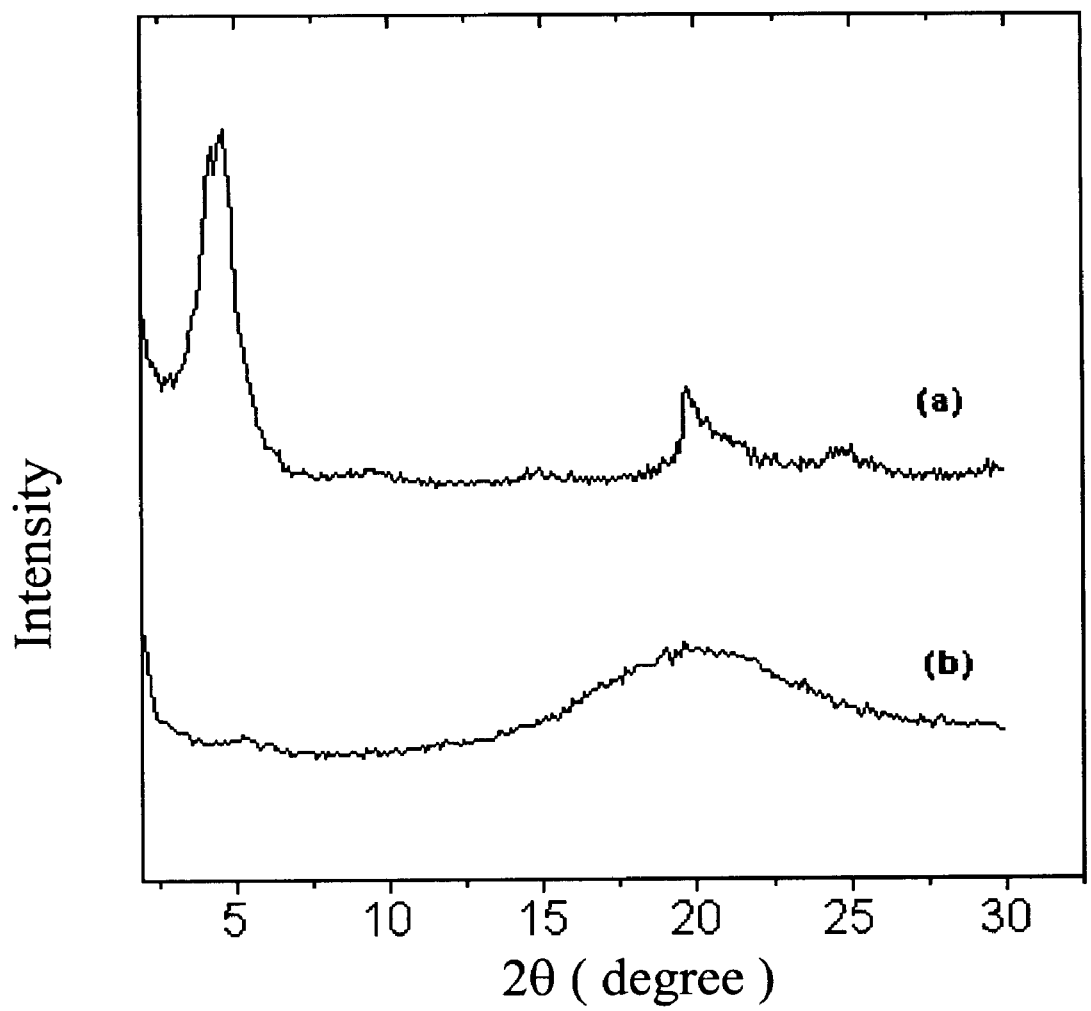
FIG. 3 illustrates X-ray diffraction profiles of (a) TEP/BEN/CLAY, and (b) epoxy/TEP/BEN/CLAY composite (5 wt % clay).

X-ray diffraction (XRD) analysis was performed on the epoxy/clay composite samples. The XRD patterns are shown in FIGS. 2–3 and the interlayer spacing data are also listed in Table 1. As shown in FIG. 2, XRD analysis of the epoxy/DICY/BEN/CLAY composite lacked clay (001) reflections between 2–10°, indicating the interlayer spacing of the clay is greater than 44 Å. The montmorillonite layers were exfoliated and uniformly dispersed in the epoxy matrix on a nanometer length scale. Referring to FIG. 3, XRD analysis of the epoxy/TEP/BEN/CLAY composite shows a weak diffraction peak at 16.8 Å. This suggests only few montmorillonite layers were not exfoliated.

The circuit boards containing epoxy/clay nanocomposites were evaluated for the coefficient of thermal expansion, moisture absorption, and thermal stability. The results are shown in Table 2. The moisture absorption was evaluated in a pressure cooker under the conditions of 120° C. and 2 hours. The thermal stability was evaluated by placing the circuit boards in a 288° C. solder bath after the moisture absorption tests. As shown in Table 2, the circuit board containing 5 wt % epoxy/DICY/BEN/CLAY had a coefficient of thermal expansion (CTE) of 41 ppm/° C. below Tg ($\alpha_1$) and 260 ppm/° C. above Tg ($\alpha_2$) in the thickness (Z) direction. The improvement in the dimensional stability is significant when compared to the counterpart in absence of the clay material, which had a CTE of 59.1 ppm/° C. below Tg, and 313 ppm/° C. above Tg in the Z direction. In addition, the water uptake was decreased by 18%, i.e., from 0.50 wt % to 0.41 wt %. This result is very desirable especially in electronic applications wherein water absorption is detrimental to dielectric performance. As to the thermal stability, the durable time in 288° C. solder bath was significantly increased from 86 seconds to over 3 minutes.

TABLE 1

Analytical Data of Clays

| | d-spacing (Å) | |
|---|---|---|
| Clay | Clay | Epoxy/Clay Composite (2 wt %) |
| Com. 2: Montmorillonite | 12.4 | 15.7 |
| Com. 3: BEN/CLAY | 18.9 | >44 |
| Com. 3: DICY/CLAY | 15.0 | 19.2 |
| Com. 3: TEP/CLAY | 13.5 | 14 |
| Ex: DICY/BEN/CLAY | 19.2 | >44 |
| Ex: TEP/BEN/CLAY | 19.9 | 16.8 (weak intensity) |

TABLE 2

Properties of Laminates Containing Epoxy/Clay Composites

| Clay | Clay content (wt %) | Thickness (mm) | CTE (ppm/° C.) $\alpha_1$ | CTE (ppm/° C.) $\alpha_2$ | Water uptake (wt %) 120° C., 2h | Thermal stability Tg (° C.) TMA | Thermal stability $t_{Sn}$ (sec) |
|---|---|---|---|---|---|---|---|
| BLANK | 0 | 1.62 | 59.7 | 313 | 0.50 | 136 | 86 |
| DICY/BEN/CLAY | 3 | 1.57 | 48.4 | 268 | 0.47 | 136 | >180 |
| DICY/BEN/CLAY | 5 | 1.60 | 41.2 | 260 | 0.41 | 136 | >180 |
| TEP/BEN/CLAY | 3 | 1.60 | 53.1 | 288 | 0.46 | 135 | >180 |
| TEP/BEN/CLAY | 5 | 1.62 | 49.6 | 268 | 0.42 | 139 | >180 |

While the invention has been particularly shown and described with reference to the preferred embodiment thereof, it will be understood by those skilled in the art that various changes in form and details may be made without departing from the spirit and scope of the invention.

What is claimed is:

1. An epoxy/clay nanocomposite, comprising:

a polymer matrix comprising an epoxy resin; and an exfoliated layered clay material uniformly dispersed in the polymer matrix, wherein the exfoliated layered clay material is present in an amount ranging from about 0.1% to 10% by weight based on the total weight of the nanocomposite and has been modified by ion exchange with (1) benzalkonium chloride and (2) dicyandiamide or tetraethylenepentamine.

2. The epoxy/clay nanocomposite as claimed in claim 1, wherein the layered clay material is present in an amount ranging from about 0.5% to 6% by weight based on the total weight of the nanocomposite.

3. The epoxy/clay nanocomposite as claimed in claim 1, wherein the layered clay material has a cation-exchange capacity ranging from about 50 to 200 meq/100 g.

4. The epoxy/clay nanocomposite as claimed in claim 1, wherein the layered clay material is selected from the group consisting of smectite clay, vermiculite, halloysite, sericite, and mica.

5. The epoxy/clay nanocomposite as claimed in claim 1, wherein the layered clay material is montmorillonite.

6. The epoxy/clay nanocomposite as claimed in claim 1, wherein the layered clay material has interlayer spacing at least about 44 Å.

7. A prepreg for a printed circuited board, which comprises:
   an epoxy/clay nanocomposite, and a glass cloth impregnated therewith, the epoxy/clay nanocomposite comprising (a) a polymer matrix comprising an epoxy resin; and (b) an exfoliated layered clay material uniformly dispersed in the polymer matrix, wherein the exfoliated layered clay material is present in an amount ranging from about 0.1% to 10% by weight based on the total weight of the nanocomposite and has been modified by ion exchange with a modifier.

8. The prepreg for a printed circuited board as claimed in claim 7, wherein the layered clay material has been modified by ion exchange with (1) benzalkonium chloride and (2) dicyandiamide or tetraethylenepentamine.

9. The prepreg for a printed circuited board as claimed in claim 7, which further comprises a curing agent.

10. The prepreg for a printed circuited board as claimed in claim 7, wherein the layered clay material is present in an amount ranging from about 0.5% to 6% by weight based on the total weight of the nanocomposite.

11. The prepreg for a printed circuited board as claimed in claim 7, wherein the layered clay material has a cation-exchange capacity ranging from about 50 to 200 meq/100 g.

12. The prepreg for a printed circuited board as claimed in claim 7, wherein the layered clay material is selected from the group consisting of smectite clay, vermiculite, halloysite, sericite, and mica.

13. The prepreg for a printed circuited board as claimed in claim 7, wherein the layered clay material is montmorillonite.

14. The prepreg for a printed circuited board as claimed in claim 7, wherein the layered clay material has interlayer spacing at least about 44 Å.

15. A printed circuit board which comprises a laminate comprising a plurality of the prepregs as set forth in claim 7, laminated on each other, at least one side of the laminate being laminated with a metallic layer.

16. The printed circuit board as claimed in claim 15, wherein the metallic layer is a copper foil.

17. The printed circuit board as claimed in claim 15, which exhibits a coefficient of thermal expansion of less than 60 ppm/° C. below the glass transition temperature (Tg) in the thickness (Z) direction.

18. The printed circuit board as claimed in claim 15, which exhibits a water uptake of less than 0.5 wt % under the conditions of 2 hours at 120° C. in a pressure cooker.

* * * * *